United States Patent
Brunner et al.

(10) Patent No.: US 7,317,325 B2
(45) Date of Patent: Jan. 8, 2008

(54) LINE SHORT LOCALIZATION IN LCD PIXEL ARRAYS

(75) Inventors: Matthias Brunner, Kirchheim (DE); Young Seop Ko, Nam-Gu Incheon (KR)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/290,932

(22) Filed: Nov. 29, 2005

(65) Prior Publication Data

US 2006/0125510 A1 Jun. 15, 2006

Related U.S. Application Data

(60) Provisional application No. 60/634,728, filed on Dec. 9, 2004.

(51) Int. Cl.
*G01R 31/00* (2006.01)

(52) U.S. Cl. ..................................................... 324/770

(58) Field of Classification Search .................... None
See application file for complete search history.

(56) References Cited

U.S. PATENT DOCUMENTS

| | | | |
|---|---|---|---|
| 4,589,139 A | 5/1986 | Hada et al. | |
| 4,820,222 A | 4/1989 | Holmberg et al. | |
| 4,825,201 A | 4/1989 | Watanabe et al. | |
| 4,870,357 A | 9/1989 | Young et al. | |
| 4,983,833 A | 1/1991 | Brunner et al. | |
| 4,983,911 A | 1/1991 | Henley | |
| 4,985,681 A | 1/1991 | Brunner et al. | |
| 5,017,755 A | 5/1991 | Yahagi et al. | |
| 5,034,683 A | 7/1991 | Takahashi et al. | |
| 5,043,297 A | 8/1991 | Suzuki et al. | |
| 5,081,687 A | 1/1992 | Henley et al. | |
| 5,235,272 A * | 8/1993 | Henley | 324/770 |
| 5,258,706 A | 11/1993 | Brunner et al. | |
| 5,268,638 A | 12/1993 | Brunner et al. | |
| 5,309,108 A * | 5/1994 | Maeda et al. | 324/501 |
| 5,371,459 A | 12/1994 | Brunner et al. | |
| 5,414,374 A | 5/1995 | Brunner et al. | |
| 5,834,773 A | 11/1998 | Brunner et al. | |
| 6,086,362 A | 7/2000 | White et al. | |
| 6,396,299 B1 * | 5/2002 | Hayashida | 324/770 |
| 6,730,906 B2 | 5/2004 | Brunner et al. | |

(Continued)

FOREIGN PATENT DOCUMENTS

EP 0 370 276 1/1991

(Continued)

OTHER PUBLICATIONS

PCT International Search Report and Written Opinion for PCT/US05/43579, dated Jan. 3, 2007 (APPM/009773.PCT).

*Primary Examiner*—Minh N. Tang
(74) *Attorney, Agent, or Firm*—Patterson & Sheridan LLP

(57) ABSTRACT

A method and apparatus for identifying a location of a short between two or more signal lines on a substrate having a plurality of thin film transistors and a plurality of pixels associated with the thin film transistors. The method includes locating the two or more signal lines having the short, locating one or more defective pixels disposed between the two or more signal lines having the short, and identifying the defective pixels as the location of the short.

9 Claims, 5 Drawing Sheets

U.S. PATENT DOCUMENTS

| | | |
|---|---|---|
| 6,815,675 B1 | 11/2004 | Lorusso et al. |
| 6,833,717 B1 | 12/2004 | Kurita et al. |
| 7,053,645 B2 * | 5/2006 | Chung ........................ 324/764 |
| 2005/0179451 A1 | 8/2005 | Brunner et al. |
| 2005/0179452 A1 | 8/2005 | Brunner et al. |

FOREIGN PATENT DOCUMENTS

| | | |
|---|---|---|
| EP | 0 542 064 | 11/1994 |
| EP | 0 932 182 | 7/1999 |

* cited by examiner

LINE SHORT LOCALIZATION IN LCD PIXEL ARRAYS

CROSS-REFERENCE TO RELATED APPLICATIONS

This application claims benefit of U.S. provisional patent application Ser. No. 60/634,728, filed Dec. 9, 2004, which is herein incorporated by reference.

BACKGROUND OF THE INVENTION

1. Field of the Invention

Embodiments of the present invention generally relate to an integrated electron beam testing system for glass panel substrates.

2. Description of the Related Art

Active matrix liquid crystal displays (LCDs) are commonly used for applications such as computer and television monitors, cell phone displays, personal digital assistants (PDAs), and an increasing number of other devices. Generally, an active matrix LCD comprises two flat plates or panels having a layer of liquid crystal materials sandwiched therebetween. The flat plates are typically made of glass, a polymer, or other material suitable for having electronic devices formed thereon. One of the flat plates typically includes a conductive film disposed thereon and may be referred to as a color filter. The other flat plate typically includes an array of thin film transistors (TFTs), each coupled to a pixel. Each pixel is activated by addressing simultaneously an appropriate data line and gate line. Each TFT may be switched on or off to generate an electrical field between a TFT and a portion of the color filter. The electrical field changes the orientation of the liquid crystal material, creating a pattern on the LCD.

Because of the high pixel densities, the close proximity of the gate lines and data lines, and the complexity of forming the TFT's, there is a high probability of defects during the manufacturing process. Known testing methods for high density LCD panels include contact testing methodologies which require connection to and testing of each individual row/column intersection within the panel array. For such testing, advanced probing technology is necessary to establish reliable contacts among the densely populated pixel elements. A high density LCD array panel typically includes 640 by 480 pixels and a typical test time for such a panel is approximately 2 hours. For a color filter having the three primary colors, for example red, green and blue, a typical test cycle requires additional connections and requires additional testing time. The time and expense of testing, although necessary, may often be a limiting factor to the commercial success of large array LCD panels.

Prior art methods of detecting defects in the flat plate having the array of TFT's are limited to isolation of a particular area of the TFT array without ascertaining the precise location of the defect, which requires additional testing to accurately determine the position of a defect. Once the defect is localized accurately, the defect may be analyzed and repaired.

Therefore, a need exists in the art for a faster and more accurate testing method, which reduces the product costs of LCD panels.

SUMMARY OF THE INVENTION

One or more embodiments of the invention are directed to a method for identifying a location of a short between two or more signal lines on a substrate having a plurality of thin film transistors and a plurality of pixels associated with the thin film transistors. The method includes locating the two or more signal lines having the short; locating one or more defective pixels disposed between the two or more signal lines having the short; and identifying a location of the defective pixels as the location of the short.

In another embodiment, a method of locating a short between at least two signal lines on a flat panel substrate having a plurality of pixels coupled to a plurality of signal lines is described. The method includes applying a first voltage to a portion of the plurality of signal lines, identifying a short between at least two signal lines within the plurality of signal lines, sensing a pixel voltage from a portion of the plurality of pixels coupled to the at least two signal lines, and isolating the location of short based on the pixel voltage.

In another embodiment, an apparatus for locating a short between at least two signal lines on a flat panel substrate having a plurality of pixels coupled to a plurality of signal lines is described. The apparatus includes a prober, a signal measurement device, a power source, and a controller configured to locate the at least two or signal lines having the short from within the plurality of signal lines, locate one or more defective pixels disposed between the at least two signal lines having the short, and identifying the defective pixels as the location of the short.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
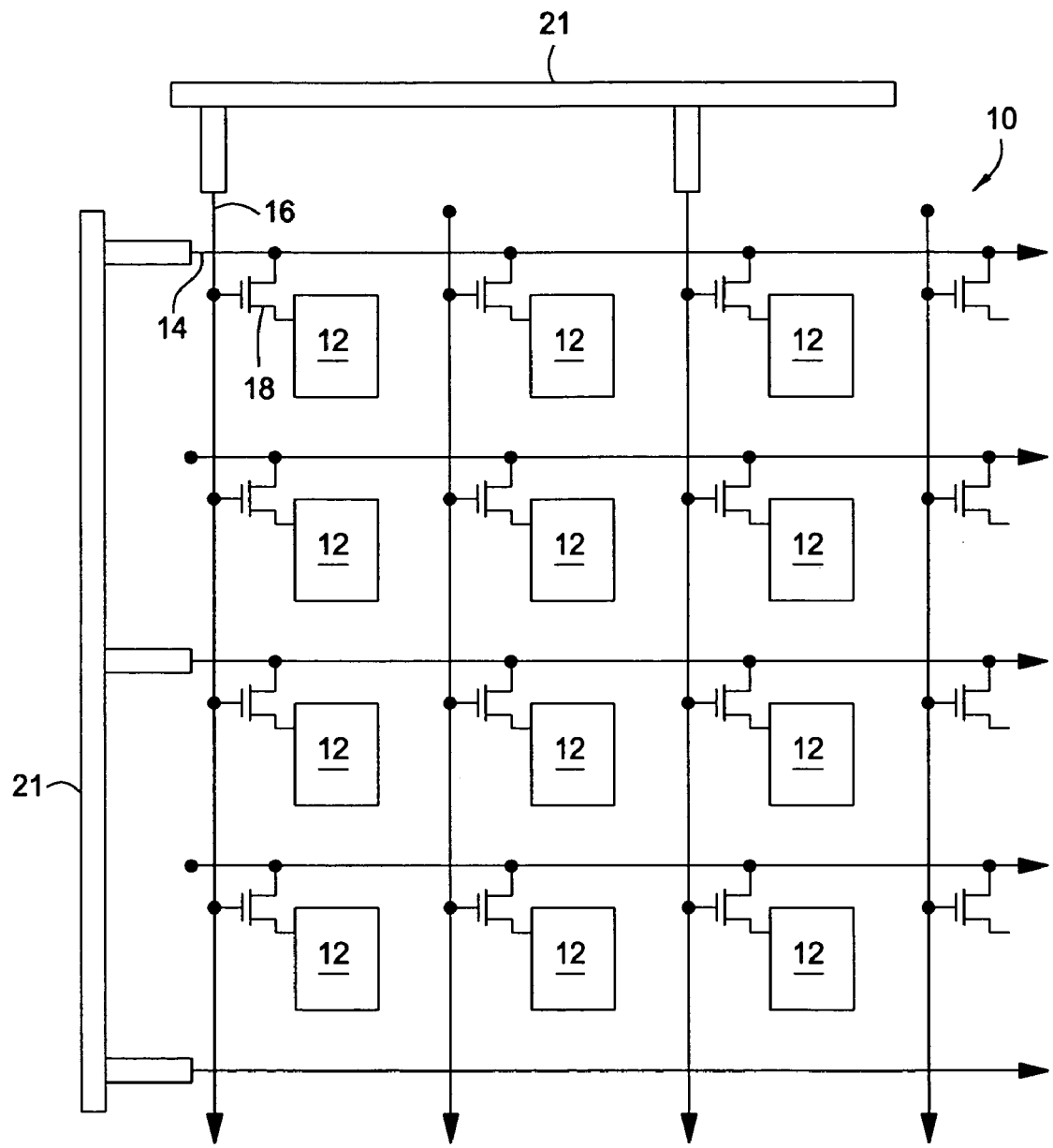
FIG. 1 (prior art) illustrates a section of an exemplary TFT substrate.

FIG. 1 illustrates a section of an exemplary flat panel substrate 10 having a plurality of pixels 12. The flat panel substrate 10 is typically a flat, rectangular piece of glass, a polymer material, or other suitable material capable of having electronic devices formed thereon, and typically has a large surface area. A thin film transistor (TFT) 18 is associated with each pixel 12. The flat panel substrate 10 further includes data lines 14 and gate lines 16. The pixels 12, TFT's 18, data lines 14 and gate lines 16 may be formed on the flat panel substrate 10 by chemical vapor deposition, plasma enhanced chemical vapor deposition, photolithographic methods, or other suitable fabrication processes. In this example, every other data line 14 is terminated along an edge of the flat panel substrate, while the other data lines 14 are terminated along the opposite, but parallel, edge. Similarly, every other gate line 16 is terminated along an edge of the flat panel substrate, while the other gate lines 16 are terminated along the opposite, but parallel, edge. Other embodiments of the invention contemplate other termination configurations for the data lines 14 and the gate lines 16. For instance, all the data lines 14 may be terminated along one edge and all the gate lines 16 may be terminated along another edge perpendicular to the edge where all the data lines 14 are terminated.

During testing of the flat panel substrate 10, two or more electrostatic discharge shorting bars 21 may be coupled to the flat panel substrate 10 at its edges. A respective electrostatic discharge shorting bar 21 shorts all the data lines 14 or gate lines 16 that terminate at a respective edge. For an interdigitated flat panel substrate, data lines are terminated at two opposing edges, while gate lines are terminated at one or both of the other two edges. Thus, three or four shorting bars are included, one per flat panel substrate edge. Other embodiments contemplate different shorting bar configurations, e.g., two or more shorting bars coupled to all the data lines 14 along one edge, and two or more shorting bars coupled to the gate lines 16 along another edge perpendicular to the edge where the shorting bars are coupled to the data lines. Until scribing and final testing of the LCD panel, the shorting bars 21 remain attached to the flat panel substrate 10 to avoid electrostatic charge buildup. Prolonged separation of the flat panel substrate 10 from the shorting bar 21 or another grounding apparatus may cause the electro-static charge to accumulate and cause damage to the active plate circuitry.

Figure 2:
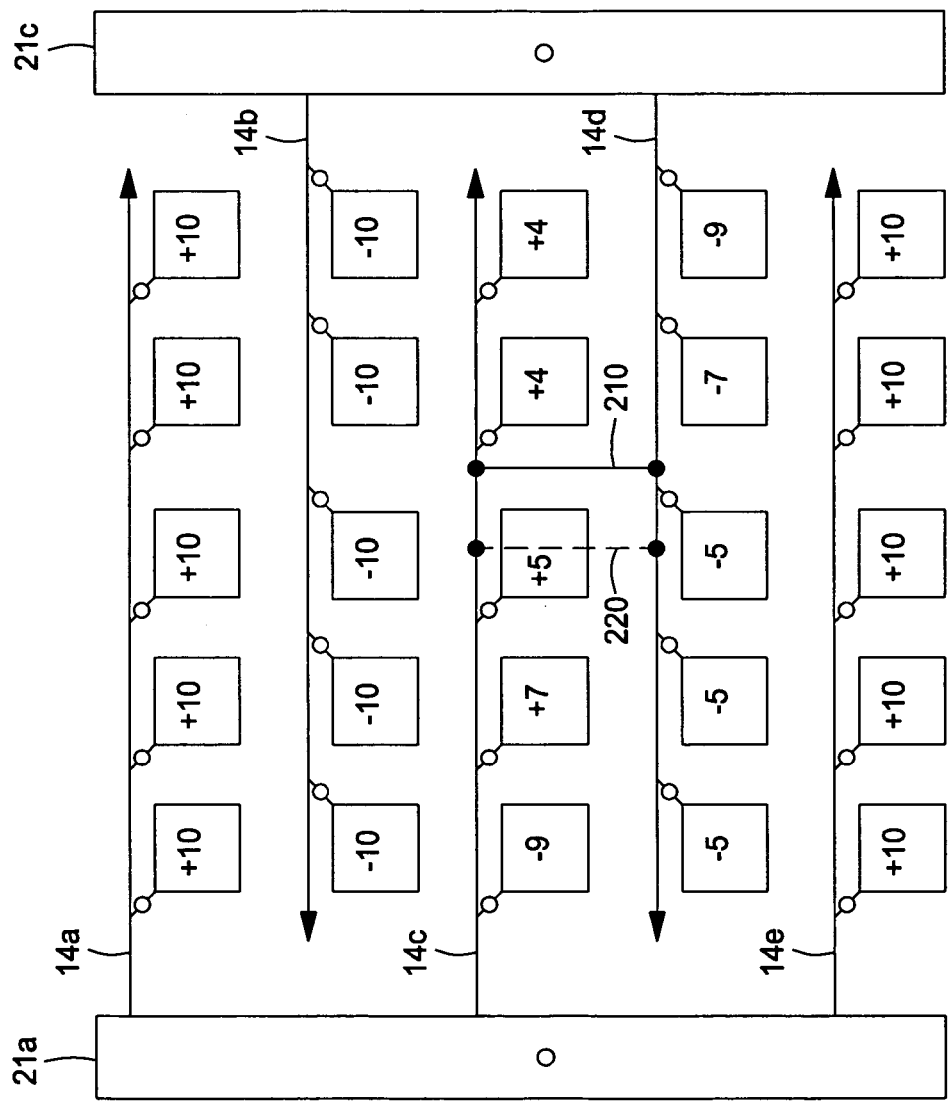
FIG. 2 (prior art) illustrates a data line to data line short on an exemplary TFT substrate.

Because of the high pixel densities, the close proximity of the gate lines and data lines, and the complexity of forming the TFT's, there is a significant probability of defects occurring during the fabrication process. TFT defects on flat panel substrates include pixel defects and/or line defects. Pixel defects may include short to pixel gate line and short to pixel data line. Line defects may include line-to-line shorts (e.g., data line to data line or gate line to gate line), cross shorts (e.g., data line to gate line), and open line defects. Other flat circuit panels, such as pc boards and multi-chip modules, may also be tested according to the various embodiments described herein:

Data line to data line shorts may be identified by applying a first voltage of one polarity to the even data lines and a second voltage of another polarity at the odd data lines. For instance, FIG. 2 illustrates a data line to data line short when a +10 volt signal is applied to shorting bar 21*a* and a −10 volt signal is applied to shorting bar 21*c*. For simplification, only the data line connections are shown. As depicted, the short occurs between data line 14*c* and data line 14*d*. The short may be positioned between pixels, and such short may be illustrated as line 210. The short may also be positioned underneath a pixel, and such short may be illustrated as dotted line 220.

Figure 3:
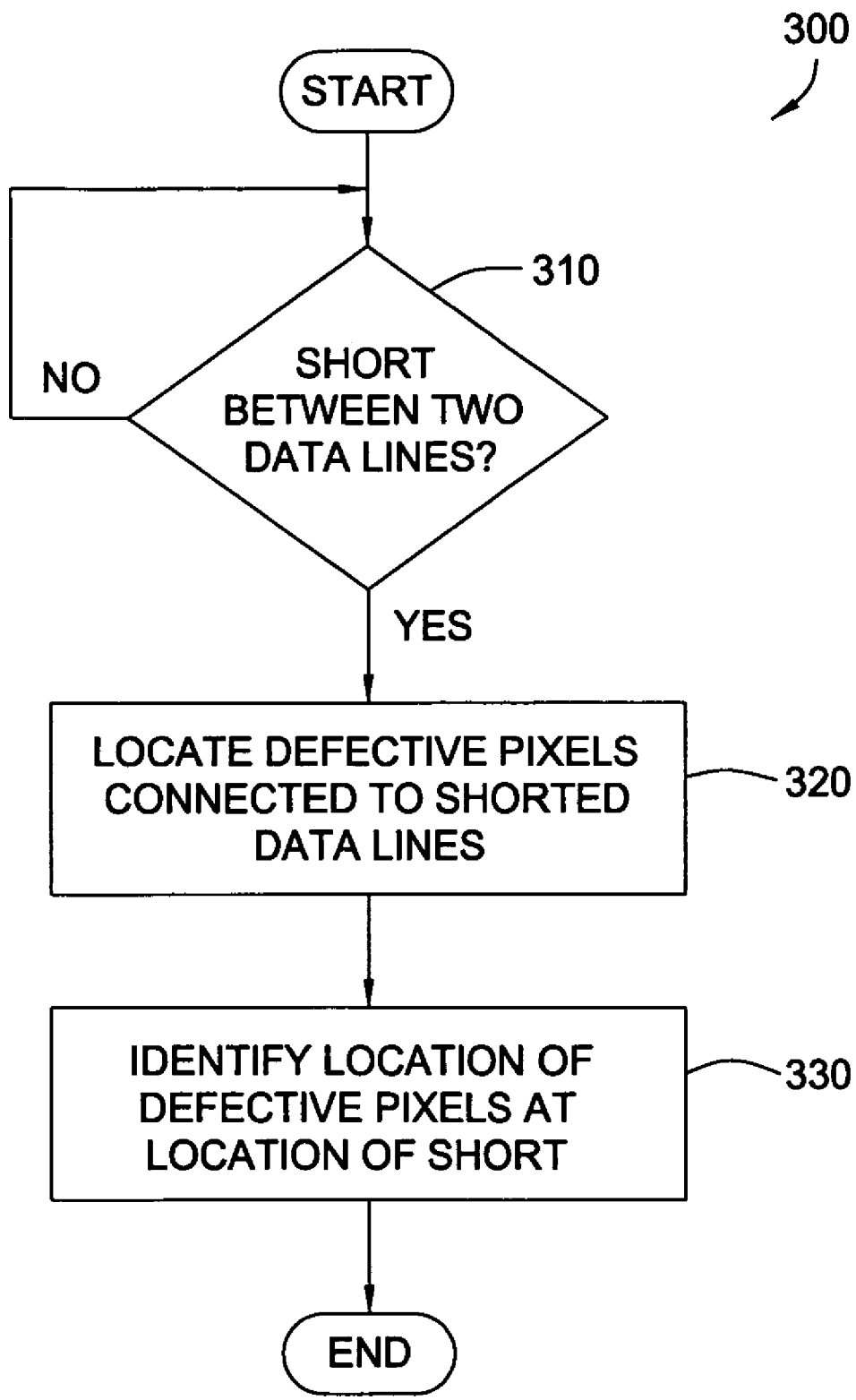
FIG. 3 illustrates a flow diagram of a method for identifying the location of a short between two data lines on the TFT substrate.

FIG. 3 illustrates a flow diagram of a method 300 for identifying the location of a short between two data lines on the flat panel substrate 10 in accordance with one or more embodiments of the invention. Although embodiments of the invention are described with reference to identifying a short between two data lines, other embodiments contemplate identifying a short between any two signal lines, e.g., between a data line and a gate line or between two gate lines.

At step 310, a determination is made as to whether a short exists between two data lines. In one embodiment, a first signal test pattern is performed on the flat panel substrate 10. The first signal test pattern may be any pattern commonly known by persons of ordinary skill in the art. In this embodiment, the first signal test pattern includes (1) opening the gates of all TFT's associated with each pixel, (2) applying a negative voltage to the odd numbered data lines and a positive voltage to the even numbered data lines, (3) closing the gates of all TFT's associated with each pixel, (4) applying a positive voltage to the odd numbered data lines and a negative voltage to the even numbered data lines, and (5) determining whether the voltage of each pixel connected to each even numbered data line is substantially the same and whether the voltage of each pixel connected to each odd numbered data line is substantially the same. If the voltage of each pixel connected to a data line is not substantially the same as explained above, then that data line has a short. The voltage of the pixel may be measured by electron beam testing, voltage image capturing or charge sensing. In this manner, the first signal test pattern is configured to determine whether any of the data lines have a short.

In another embodiment, a prober test may be performed prior to performing the first signal test pattern to determine whether a short exists on the substrate. In this embodiment, the resistance between opposing shorting bars may be measured. A high measurement of resistance between opposing shorting bars indicates the absence of a short between data lines. On the other hand, a low measurement of resistance between opposing shorting bars indicates the presence of a short between data lines.

If a short exists between at least two data lines, then one or more pixels between the shorted data lines are located (step 320). In one embodiment, a second signal test pattern is performed on the flat panel substrate 10. The second signal test pattern may be any pattern commonly known by persons of ordinary skill in the art. In this embodiment, the second signal test pattern includes (1) opening the gates of all the TFT's associated with each pixel, (2) applying a negative voltage to the odd numbered and even numbered data lines, (3) closing the gates of all the TFT's associated with each pixel, (4) applying a positive voltage to the odd numbered and even numbered data lines, and (5) measuring the voltage of each pixel. If the voltage of a pixel is positive, then that pixel has a short, i.e., that pixel may be shorted with one of the data lines having a short or may be coupled to a conductive layer disposed beneath the pixel. The voltage of each pixel may be measured by using electron beam testing, voltage image capturing, charge sensing and the like. In this manner, the second signal test pattern is configured to locate one or more defective pixels that are connected to the shorted data lines.

At step 330, the location of the defective pixels is identified as the location of the short between the two data lines. Current technology for locating a short between data lines is often limited to locating the shorted data lines, and not the location of the short. Various embodiments of the invention, however, are configured to identify the location of the short, which enables a more efficient repair of the short.

Figure 4:
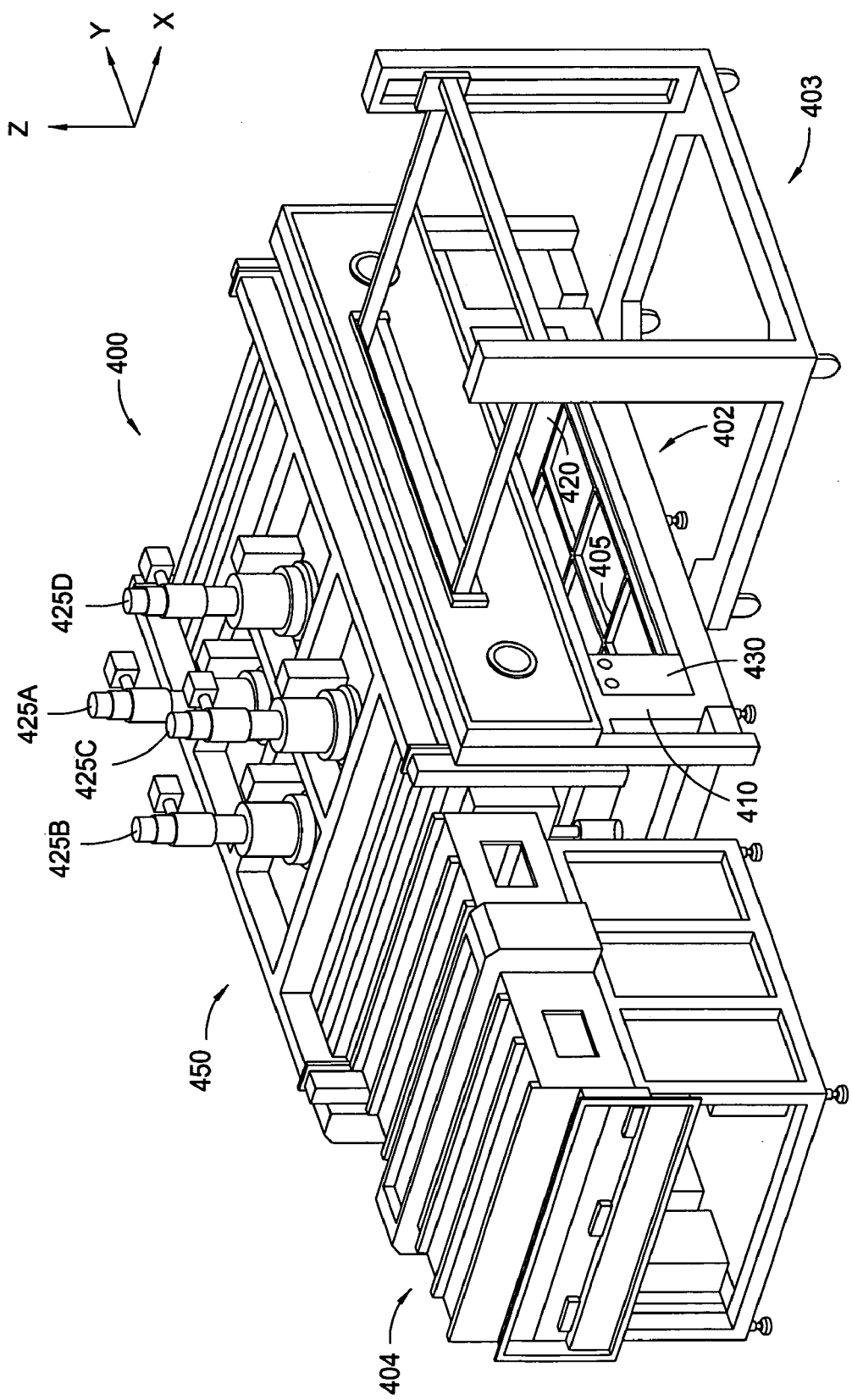
FIG. 4 shows a schematic view of one embodiment of an electron beam test apparatus that may be used for electron beam testing.

FIG. 4 shows a schematic view of an electron beam test system 400 that may be exemplarily used for electron beam testing in connection with one or more embodiments of the invention. The electron beam test system 400 is an integrated system requiring minimum space, and is capable of testing large glass panel substrates, up to and exceeding 1.9 meters by 2.2 meters. The electron beam test system 400 includes a prober storage assembly 402, a prober transfer assembly 403, a load lock chamber 404, and a testing chamber 450. The prober storage assembly 402 houses one or more probers 405 proximal the test chamber 450 for easy use and retrieval. Preferably, the prober storage assembly 402 is disposed beneath the test chamber 450, reducing the clean room space needed for a contaminant free and efficient operation. The prober storage assembly 402 preferably has dimensions approximating those of the testing chamber 450 and is disposed on a mainframe 410 supporting the testing chamber 450. The prober storage assembly 402 includes a shelf 420 disposed about the mainframe 410 to provide a support for the one of more probers 405. The prober storage assembly 402 may further include a retractable door 430 that can seal off the storage area and protect the stored probers 405 when not in use.

The electron beam test system 400 further includes four EBT columns 425A, 425B, 425C, and 425D. The EBT columns 425A/B/C/D are disposed on an upper surface of the test chamber 450. During electron beam testing, certain voltages are applied to the TFT's by using one or more probers, and the electron beam from an EBT column is directed to the individual pixels under investigation. Secondary electrons emitted from the pixels are sensed to determine the TFT voltages. Additional details concerning the testing of pixels and the operation and features of the illustrative EBT test system 400 are disclosed in commonly assigned U.S. Pat. No. 6,833,717, which issued Dec. 21, 2004, entitled "Electron Beam Test System with Integrated Substrate Transfer Module," which is incorporated herein in its entirety by reference.

Figure 5:
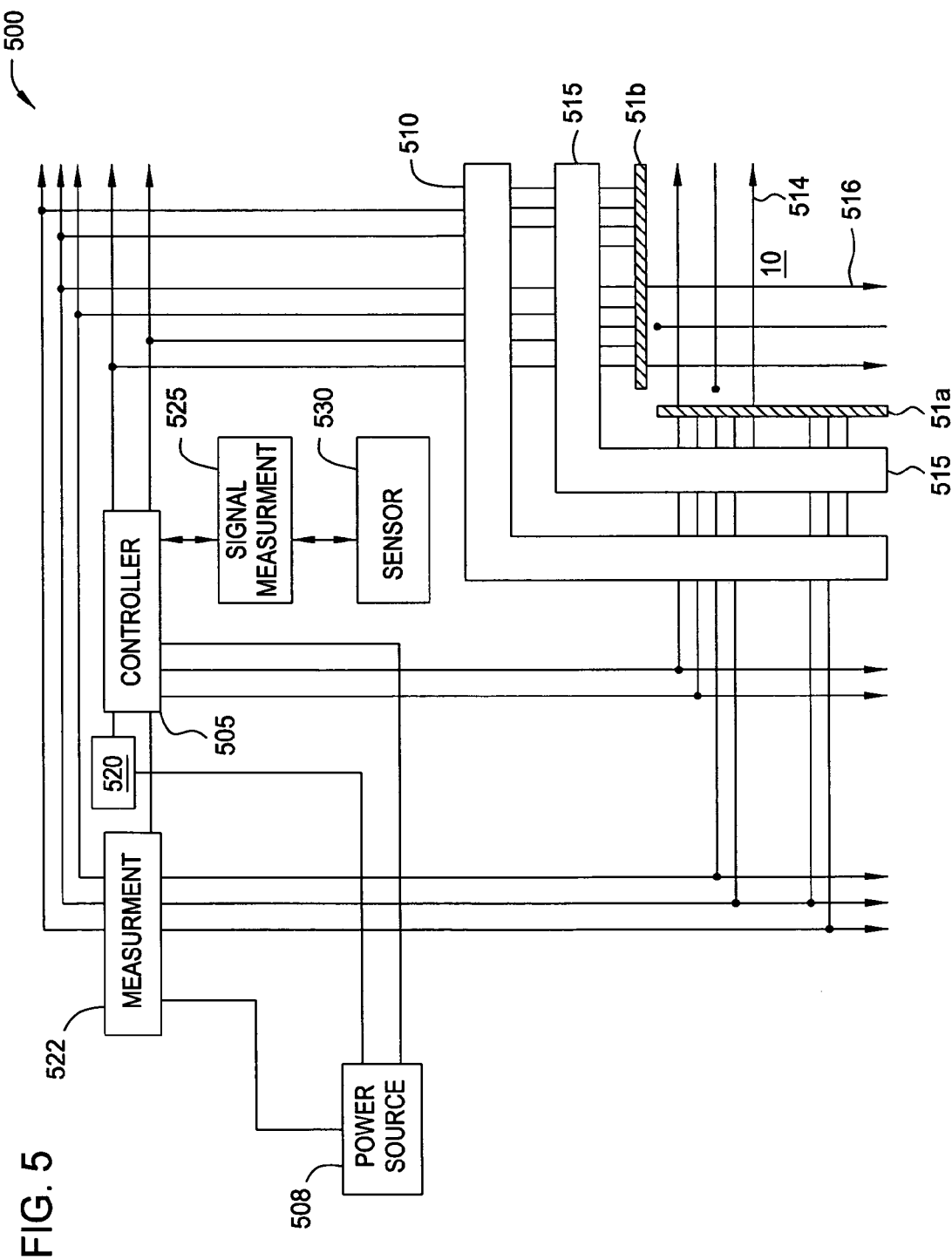
FIG. 5 is a schematic view of one embodiment of a test system that may be used for electron beam testing, charge sensing, or voltage imaging.

FIG. 5 is a schematic view of one embodiment of a test apparatus 500 for determining the location of a short on a flat panel substrate 10. The test apparatus 500 includes a circuit interface 510 coupled to the flat panel substrate 10 under test via a prober 515 coupled to shorting bars 51*a* and 51*b*. The circuit interface 510 relays signals from a pattern generating apparatus 520 and/or a measurement apparatus 522 to the data lines 514 and the gate lines 516 in communication with respective shorting bars. Optionally, the circuit interface 510 relays signals from the data lines 514 and gate lines 516 to the measurement apparatus 522 and/or the pattern generating apparatus 520. A controller 505 is also provided to govern whether the pattern generator 520 or measurement apparatus 522 is coupled to the flat panel substrate 10. A signal measurement device 525 is also provided to sense voltage and/or current along the data lines 514 and/or the gate lines 516. An optional sensor 530 may also be used to detect signals from the data lines 514 and/or the gate lines 516. The signal measurement device 525 may be an electron beam column, a charge sensing apparatus, or a voltage imaging apparatus. The sensor 530 may be a secondary electron sensor adapted to sense backscatter electrons from the flat panel substrate 10. Alternatively, the sensor 530 may be a sensor configured to compliment any signal measurement device known in the art.

In operation, the controller 505 is coupled to the flat panel substrate 10 through the prober 515. The prober 515 is in communication with a power source 508 that, for example, may provide a signal to each of the contact points on the prober 515. The contact points are in communication with respective data lines 514 and gate lines 516, which are coupled to the respective shorting bars 51*a* and 51*b*. In accordance with one or more embodiments of the invention, the controller 505 is adapted to provide and/or measure the signals to or from the flat panel substrate 10.

While the foregoing is directed to embodiments of the present invention, other and further embodiments of the invention may be devised without departing from the basic scope thereof, and the scope thereof is determined by the claims that follow.

The invention claimed is:

1. A method for identifying a location of a short between two or more signal lines on a substrate having a plurality of thin film transistors and a plurality of pixels associated with the thin film transistors, comprising:
   locating the two or more signal lines having the short by performing a first signal test pattern;
   locating one or more defective pixels disposed between the two or more signal lines having the short; and
   identifying a location of the defective pixels as the location of the short, wherein the first signal test pattern comprises:
   opening the gates of the thin film transistors;
   applying a first voltage to odd numbered data lines and a second voltage to even numbered data lines;
   closing the gates of the thin film transistors;
   applying the second voltage to the odd numbered data lines and the first voltage to the even numbered data lines; and
   determining whether the voltage of each pixel connected to each even numbered data line is substantially the same and whether the voltage of each pixel connected to each odd numbered data line is substantially the same.

2. The method of claim 1, wherein the first voltage is a negative voltage and the second voltage is a positive voltage.

3. The method of claim 1, further comprising determining that a data line has a short, if the voltage of each pixel connected to the data line is not substantially the same.

4. The method of claim 1, wherein the voltage of each pixel is determined using one of electron beam testing, voltage image capturing or charge sensing.

5. The method of claim 1, wherein locating the defective pixels comprises performing a second signal test pattern.

6. The method of claim 5, wherein the second signal test pattern comprises:
   opening the gates of the thin film transistors;
   applying a third voltage to odd numbered and even numbered data lines;
   closing the gates of the thin film transistors;
   applying a fourth voltage to the odd numbered and even numbered data lines; and
   measuring the voltage of each pixel.

7. The method of claim 6, wherein the third voltage is a negative voltage and the fourth voltage is a positive voltage.

8. The method of claim 6, further comprising determining a pixel defective if the measured voltage of the pixel is positive.

9. The method of claim 6, wherein the measured voltage of each pixel is determined using one of electron beam testing, voltage image capturing, or charge sensing.

* * * * *